(12) United States Patent
Aida et al.

(10) Patent No.: US 6,849,900 B2
(45) Date of Patent: Feb. 1, 2005

(54) SEMICONDUCTOR DEVICE

(75) Inventors: Satoshi Aida, Kanagawa (JP); Shigeo Kouzuki, Kanagawa (JP); Masaru Izumisawa, Kanagawa (JP); Hironori Yoshioka, Kanagawa (JP); Wataru Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 10/606,755

(22) Filed: Jun. 27, 2003

(65) Prior Publication Data

US 2004/0206989 A1 Oct. 21, 2004

(30) Foreign Application Priority Data

Apr. 16, 2003 (JP) ......................................... 2003-111190

(51) Int. Cl.$^7$ ......................... H01L 29/76; H01L 29/94; H01L 31/062; H01L 31/113; H01L 31/119
(52) U.S. Cl. ..................................................... 257/341
(58) Field of Search ................................. 257/341, 262, 257/220, 302, E29.066, E29.15, E29.162

(56) References Cited

U.S. PATENT DOCUMENTS

| 4,754,310 | A |   | 6/1988 | Coe |
|---|---|---|---|---|
| 5,216,275 | A |   | 6/1993 | Chen |
| 5,438,215 | A |   | 8/1995 | Tihanyi |
| 5,831,317 | A | * | 11/1998 | Shimazaki ................. 257/401 |
| 6,410,958 | B1 |   | 6/2002 | Usui et al. |

FOREIGN PATENT DOCUMENTS

| JP |    8-222735 | 8/1996 |
|---|---|---|
| JP |   10-223896 | 8/1998 |
| JP | 2000-269518 | 9/2000 |

(List continued on next page.)

*Primary Examiner*—Craig A. Thompson
(74) *Attorney, Agent, or Firm*—Oblon, Spivak, McClelland, Maier & Neustadt, P.C.

(57) ABSTRACT

A semiconductor device includes: a semiconductor substrate of a first conductivity type; a semiconductor layer of a first conductivity type formed on a first main surface of the semiconductor substrate, the semiconductor layer including a first region for a cell portion and a second region for a terminating portion, the second region being positioned in an outer periphery of the first region, the terminating portion maintaining breakdown voltage by extending a depletion layer to relieve an electric field; junction pairs of semiconductor layers periodically arranged so as to form a line from the first region to the second region in a first direction parallel to the first main surface in the semiconductor layer and having mutually opposite conductivity types of impurities, each of the junction pair being composed of a first impurity diffusion layer of a second conductivity type formed from a surface of the semiconductor layer toward the semiconductor substrate and a second impurity diffusion layer of a first conductivity type formed from the surface of the semiconductor layer toward the semiconductor substrate and adjacently to the first impurity diffusion layer; a base layer of a second conductivity type selectively formed on each surface layer of the junction pairs which are formed in the first region, so as to connect with the first impurity diffusion layer and the second impurity diffusion layer in the same manner; a source layer of a first conductivity type selectively formed on each surface layer of the base layers of the second conductive type; a control electrode formed above each surface of the base layers and above each surface of the source layers via an insulating film; a first main electrode formed so as to cover the control electrode and to contact the source layers and the base layers in the same manner; and a second main electrode formed on a second main surface opposite to the first main surface of the semiconductor substrate.

10 Claims, 12 Drawing Sheets

FOREIGN PATENT DOCUMENTS

| | | |
|---|---|---|
| JP | 2000-277726 | 10/2000 |
| JP | 2001-15752 | 1/2001 |
| JP | 2001-135819 | 5/2001 |
| JP | 2001-298190 | 10/2001 |
| JP | 2001-298191 | 10/2001 |
| JP | 2002-110693 | 4/2002 |
| JP | 2002-170955 | 6/2002 |
| JP | 2002-217415 | 8/2002 |
| JP | 2002-280555 | 9/2002 |

* cited by examiner

SEMICONDUCTOR DEVICE

CROSS REFERENCE TO RELATED APPLICATION

This application claims benefit of priority under 35USC § 119 to Japanese patent application No. 2003-111190, filed on Apr. 16, 2003, the contents of which are incorporated by reference herein.

BACKGROUND OF THE INVENTION

1. Field of the Invention

The present invention relates to a semiconductor device and an improvement of a breakdown voltage structure in a terminating portion of, for example, a vertical MOSFET (Metal Oxide Semiconductor Field Effect Transistor), an IGBT (Insulated Gate Bipolar Transistor) or the like.

2. Related Background Art

A vertical MOSFET structure has been employed in power devices such as a power MOSFET and an IGBT. Particularly, the power MOSFET is a key device essential for increasing efficiency of a switching power supply that is widely used in data communication devices, portable devices, electronic devices, etc. In order to increase the efficiency of the switching power supply, it is important to reduce loss in switching devices, and more particularly, the reduction in ON-resistance has been one of the most important issues in a high breakdown voltage MOSFET used on a primary side of the power supply. As a structure capable of drastically reducing the ON-resistance of the high breakdown voltage MOSFET, a so-called multi RESURF structure, where a drift layer of the MOSFET is replaced with RESURF, has already been proposed and commercialized in part. One example of the multi RESURF structure is shown in a cross-sectional view of FIG. 9. It is to be noted that the same elements in the attached drawings are indicated with the same reference numerals, and repetitive explanations thereof will be appropriately omitted.

Achievement of both the high breakdown voltage and low ON-resistance is attempted using the multi RESURF structure of the MOSFET shown in FIG. 9 in that the MOSFET maintains high breakdown voltage by virtue of depletion due to its charge compensation effect in an OFF-state, and in that currents flow through a high concentration region of the MOSFET in an ON-state. However, present technologies have difficulty in forming such a multi RESURF structure by a method other than a so-called multi epitaxial growth technique in which RESURF N layers and P layers are alternatively laminated. Explaining the multi epitaxial growth technique using the MOSFET shown in FIG. 9, the technique is a method in which there is repeated several times a step where a thin N-type impurity diffusion layer 12 is epitaxially grown on an N++ type semiconductor substrate W, and then a P type impurity diffusion layer 118 and an N type impurity diffusion layer 116 having the same thickness as the P type impurity diffusion layer 118 are formed through desired patterning. This method considerably increases a production cost due to the repetition of the epitaxial growth step, which eliminates the merits that the ON-resistance of the device can be lowered. To overcome this problem of the cost, a so-called trench multi RESURF structure has been proposed in which after a trench is formed, a RESURF N (or P) layer is formed on side faces of the trench (for example, Japanese Patent No. 3291957 (Fujishima) and U.S. Pat. No. 6,040,600 (Minato)). As shown in a cross-sectional view in the upper part of FIG. 10, in the trench multi RESURF structure disclosed by Fujishima an N type impurity diffusion layer (hereinafter referred to simply as the N layer) and a P type impurity diffusion layer (hereinafter referred to simply as the P layer) for charge compensation are repetitively formed and two pairs of N layer/P layer are disposed between two insulating layers 54 buried in trenches TR4. This trench multi RESURF structure is obtained by, for example, forming the trench TR4 in a P type epitaxial growth layer and further forming N layers 56 on two side faces of the trench TR4. In this case, profiles of the N layer 56 may cause variations in charge compensation. As shown by a graph in the lower part of FIG. 10, profile overlapping portions PFPN of the N layer 56 and a P type epitaxial growth layer 58 are automatically charge-compensated, however, if charge amount is not equal between individually remaining portions $PF_P$ and $PF_N$, the breakdown voltage of the device is consequently lowered. Since quantity imbalance between an N type impurity and a P type impurity may result in lowered breakdown voltage, such variations would be a disadvantage.

Furthermore, in the example disclosed by Fujishima, the higher an impurity concentration of the P type epitaxial growth layer to become the base is, the higher an impurity concentration of the N layer 56 must be raised for attenuation. Therefore, if the variations are caused in a constant proportion, the absolute values thereof would necessarily become large.

On the other hand, in an example disclosed by Minato as shown in FIG. 11, there is only one pair of N/P layers for charge compensation between two insulating layers 14 buried in repetitive trenches TR2. This trench multi RESURF structure is obtained by forming the trench TR2 and thereafter forming an N layer 16 on one side thereof and a P layer 18 on the other side thereof, as shown by arrows in FIG. 11. The structure disclosed by Minato has no profile overlapping portions between the N/P layers unlike the example of Fijishima, which thus eliminates the necessity of raising the concentrations of the N layer and P layer more than necessary. Therefore, the structure disclosed by Minato has an advantage over characteristic variability. For this reason, it seems as if the structure disclosed by Minato had already solved the disadvantage of the characteristic variability together with the initial problem of the cost.

The structure disclosed by Minato in which the N layer 16 is formed on one side of the trench TR2 and the P layer 18 is formed on the other side thereof can indeed achieve charge compensation between the insulating layers 14 buried in the trenches TR2 in a cell portion of a device, however, only either one of the N layer and P layer exists on an outer side of the insulating layer 14 in a terminating portion surrounding the cell portion of the device. Thus, there is no counterpart impurity diffusion layer for charge compensation in the terminating portion, which causes so-called charge unbalance, thus disadvantageously lowering the breakdown voltage of the device. More details in this regard will be described referring to FIG. 12.

FIG. 12 is a schematic cross-sectional view showing a structure in the terminating portion of the MOSFET in FIG. 11. In an example of the terminating portion shown in the right half part of the FIG. 12, a voltage is applied between a RESURF N layer 88ER connected to a drain electrode 34 via the N++ type semiconductor substrate W and RESURF P layers 52 and 18 connected to a source electrode 32, so that an electric field concentrates at an insulator 14 (region indicated by a broken line C2) in the trench TR2 therebetween. In an example of an opposite side of the terminating portion shown in the left half part of the FIG. 12, an N layer 16 and a P layer 88EL for charge compensation are separated by the insulator 14 in the trench TR2 and thus the P layer 88EL is redundant. In this case, charges (hole) in the P layer 88EL are not discharged even when the voltage is applied, therefore the electric field intensity in this region (indicated by a broken line C4) becomes higher than that in the RESURF part, resulting in failure to obtain the original breakdown voltage of RESURF in the structure shown in FIG. 12. Accordingly, there exists a problem that the structure shown in FIG. 12 cannot offer the desired breakdown voltage.

For a terminating portion of a conventional MOSFET, a breakdown voltage structure such as a guard ring is provided to keep its breakdown voltage stable, however, in the MOSFET of the trench multi RESURF structure shown in FIG. 12, the guard ring itself may cause the charge unbalance, therefore, the conventional breakdown voltage structure for the terminating portion can never be employed. It is conceivable that, in order to eliminate influences of the redundant N layer and P layer in the terminating portion, a trench width between the N and P layers (a lateral distance of the insulator separating therebetween) is enlarged to thereby maintain the breakdown voltage at the insulator in the trench. However, the width of the insulator is required not less than 6 im to stably form a device having the breakdown voltage of 600V, for example. There is yet no technique of completely burying an insulator in such a wide trench.

BRIEF SUMMARY OF THE INVENTION

According to the present invention, there is provided a semiconductor device comprising:
  a semiconductor substrate of a first conductivity type;
  a semiconductor layer of a first conductivity type formed on a first main surface of the semiconductor substrate, the semiconductor layer including a first region for a cell portion and a second region for a terminating portion, the second region being positioned in an outer periphery of the first region, said terminating portion maintaining breakdown voltage by extending a depletion layer to relieve an electric field;
  junction pairs of semiconductor layers periodically arranged so as to form a line from the first region to the second region in a first direction parallel to the first main surface in the semiconductor layer and having mutually opposite conductivity types of impurities, each of said junction pair being composed of a first impurity diffusion layer of a second conductivity type formed from a surface of the semiconductor layer toward the semiconductor substrate and a second impurity diffusion layer of a first conductivity type formed from the surface of the semiconductor layer toward the semiconductor substrate and adjacently to the first impurity diffusion layer;
  a base layer of a second conductivity type selectively formed on each surface layer of said junction pairs which are formed in the first region, so as to connect with the first impurity diffusion layer and the second impurity diffusion layer in the same manner;
  a source layer of a first conductivity type selectively formed on each surface layer of the base layers of the second conductive type;
  a control electrode formed above each surface of the base layers and above each surface of the source layers via an insulating film;
  a first main electrode formed so as to cover the control electrode and to contact the source layers and the base layers in the same manner; and
  a second main electrode formed on a second main surface opposite to the first main surface of the semiconductor substrate.

DETAILED DESCRIPTION OF THE INVENTION

Some of embodiments according to the present invention will be described below with reference to drawings.

Figure 1:
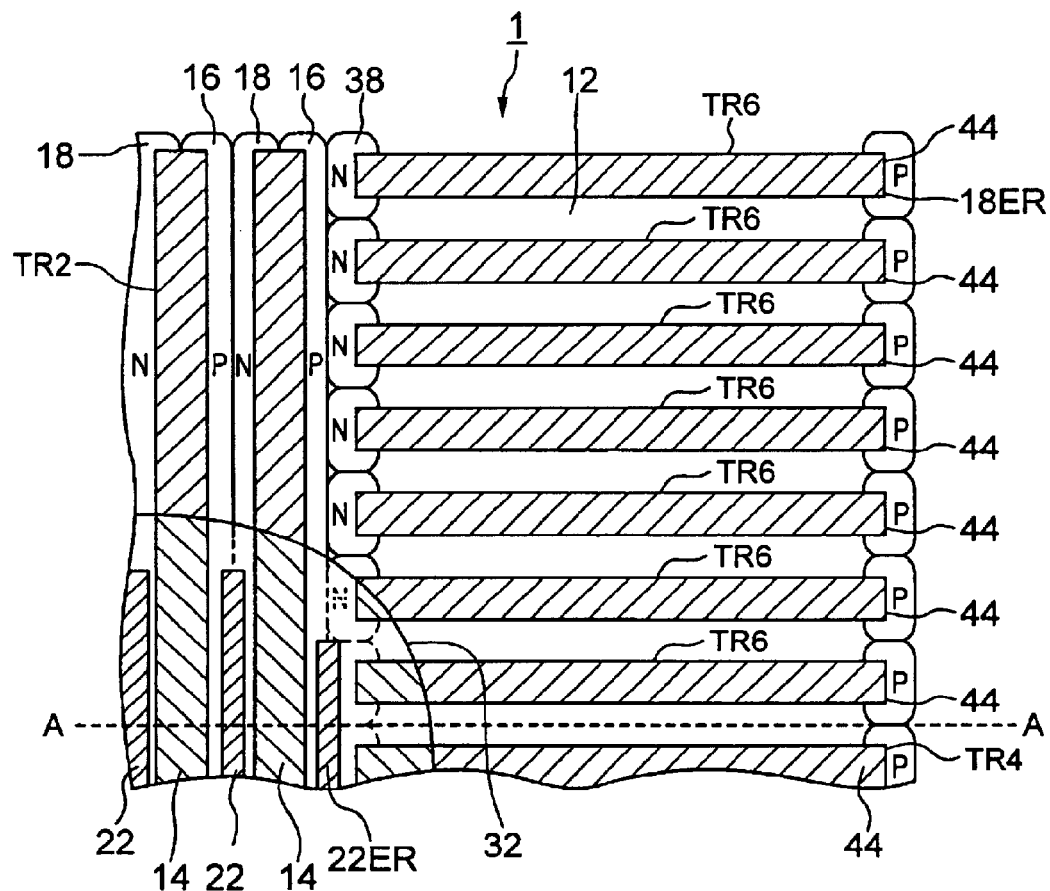
FIG. 1 is a plan view showing a main part in a first embodiment of a semiconductor device according to the present invention.
Figure 2:
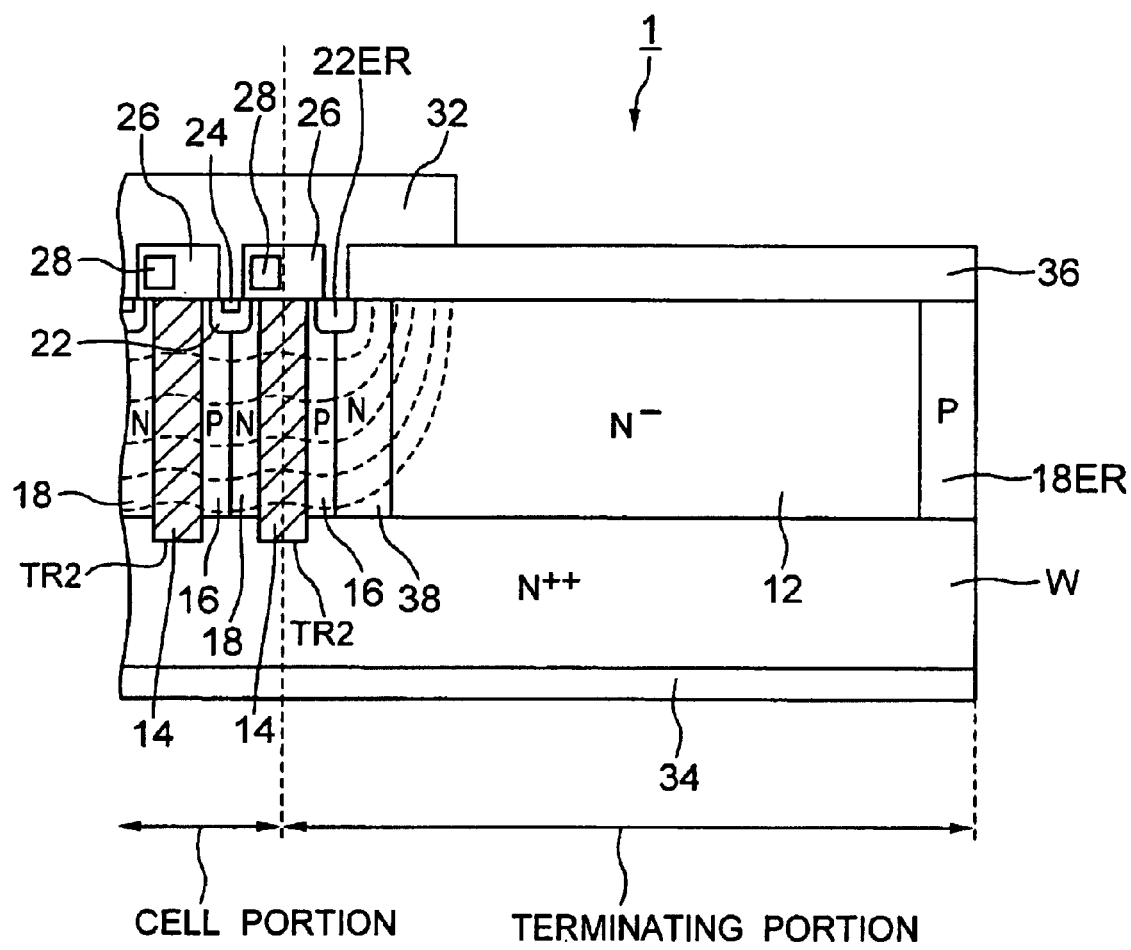
FIG. 2 is a cross-sectional view taken along line A—A in FIG. 1.
Figure 3:
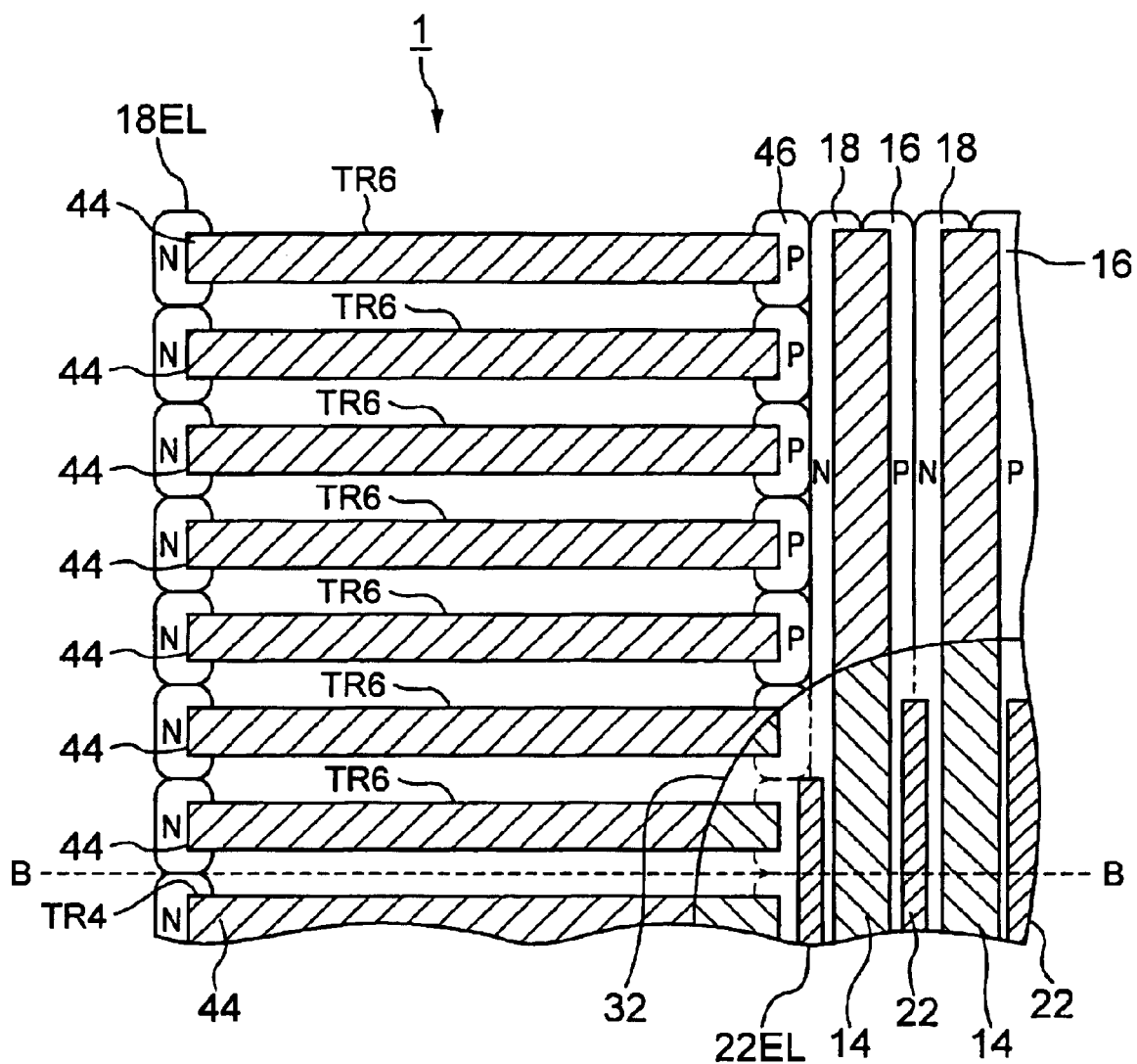
FIG. 3 is a plan view showing an opposite side of a terminating portion of the semiconductor device shown in FIG. 1.
Figure 4:
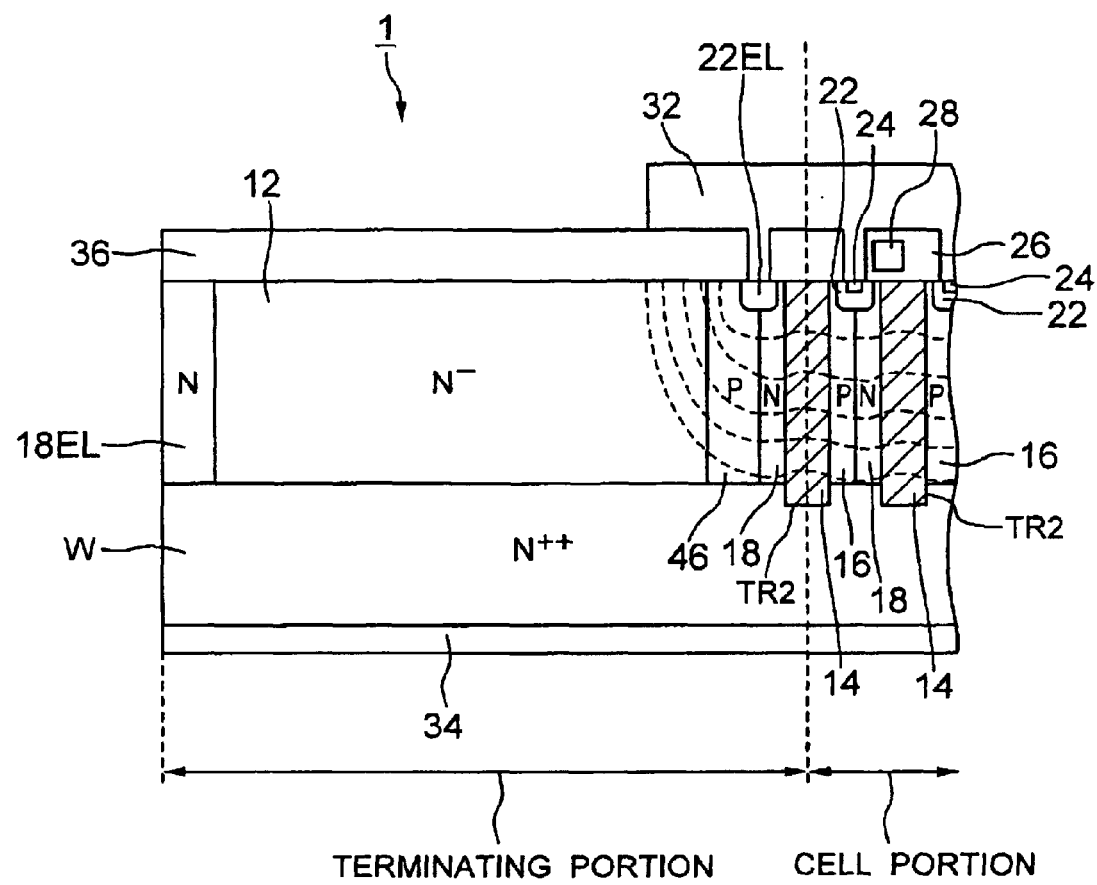
FIG. 4 is a cross-sectional view along a line B—B in FIG. 3.

FIG. 1 is a plan view showing one side of a terminating portion in a first embodiment of a semiconductor device according to the present invention, and FIG. 2 is a cross-sectional view taken along line A—A in FIG. 1. FIG. 3 is a plan view showing the other side of the terminating portion of the semiconductor device shown in FIG. 1, and FIG. 4 is a cross-sectional view taken along line B—B in FIG. 3. The semiconductor device in this embodiment is characterized in that, an N layer 38 is provided on an outer side of an outermost layer of P layers 16 adjacently thereto in the terminating portion shown in FIGS. 1 and 2, and a P layer 46 is provided on an outer side of an outermost layer of N layers 18 adjacently thereto in the terminating portion shown in FIGS. 3 and 4, whereby a device has the same charge compensation structure even in its terminating portion. The semiconductor device according to this embodiment will be described in more detail below.

A power MOSFET 1 of a vertical trench multi RESURF structure shown in FIGS. 1 to 4 comprises an N++ type semiconductor substrate W to be a drain layer, a drain electrode 34, an epitaxial growth layer 12, a P type base layer 22, an N+ type source layer 24, insulators 14 formed to be buried in trenches TR2, N layers 18 and P layers 16 formed on respective side faces of the trenches TR2, a gate electrode 28 provided via gate insulating layers 26 above both surfaces of the N layers 18 and the base layers 22 contacting the N layers 18, and a source electrode 32 formed in a cell portion so as to fill a region between the gate insulating layers 26 and to contact the N+ type source layer 24. The drain electrode 34 is formed on one surface of the N++ type semiconductor substrate W, and the epitaxial growth layer 12 is formed by doping an N type impurity at a low concentration on the other surface of the N++ type semiconductor substrate W. The P type base layer 22 is selectively formed on a surface part of the epitaxial growth layer 12 so as to have a striped plane shape arranged in a specific pitch. The N+ type source layer 24 is selectively formed on a surface part of the base layer 22. The trenches TR2 are provided so as to extend through the epitaxial growth layer 12 into the semiconductor substrate W in a region between two base layers 22, and the N layer 18 and the P layer 16 are formed by ion implantation from an oblique direction into the opposite two sides of the trench TR2 and by heat treatment. As shown in FIG. 1, the trenches TR2 in this embodiment are extended in a longitudinal direction of stripes beyond a region of the cell portion to the vicinity of a peripheral edge of a device.

The power MOSFET 1 of the vertical trench multi RESURF structure shown in FIGS. 1 to 4 further comprises N layers 38 formed on the outer side of the outermost P layer 16 adjacently thereto, insulators 44 provided in a prescribed pitch in the terminating portion of the epitaxial growth layer 12 and formed to be buried into trenches TR6 whose longitudinal direction is orthogonal to the trenches TR2 in the cell portion, P layers 18ER provided in a peripheral edge of the terminating portion on the right side of the drawing sheet of FIG. 1, N layers 18EL provided in another peripheral edge of the terminating portion on the left side of the drawing sheet of FIG. 3, and a field oxide layer 36 disposed so as to cover the entire terminating portion. The N layer 38 and the N layer 18EL are formed, after the trench TR 6 is formed, by implanting an N type impurity obliquely from above into the left side face of the trench TR6 in the longitudinal direction thereof thereafter subjecting it to heat treatment. The P layer 18ER and the P layer 46 are formed by implanting a P type impurity obliquely from above into the right side face of the trench TR6 in the longitudinal direction thereof thereafter subjecting it to heat treatment.

Thus, according to the trench multi RESURF structure of this embodiment, a device has the same charge compensation structure even in its terminating portion, thereby an electric potential is dispersed toward the outside of the combination of the P layer and N layer (16 and 38, or 18 and 46) provided on the outer side of the insulator 14 without concentrating at the insulator 14 in the trench TR2. This allows the semiconductor device to have sufficient breakdown voltage even in the terminating portion.

Next, a second embodiment of the semiconductor device according to the present invention will be described with reference to FIGS. 5 to 8.

Figure 5:
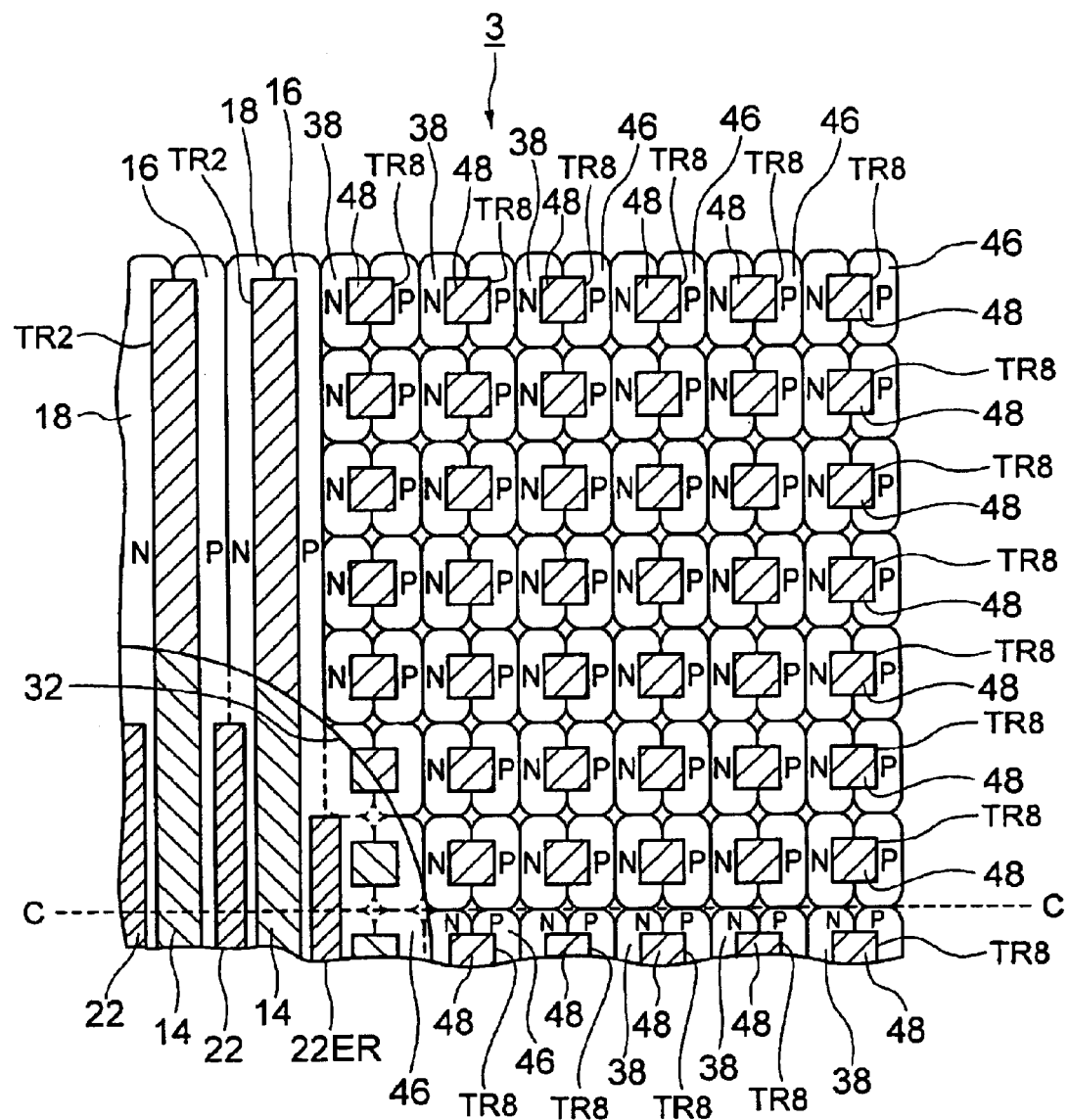
FIG. 5 is a plan view showing a main part of a second embodiment of the semiconductor device according to the present invention.
Figure 6:
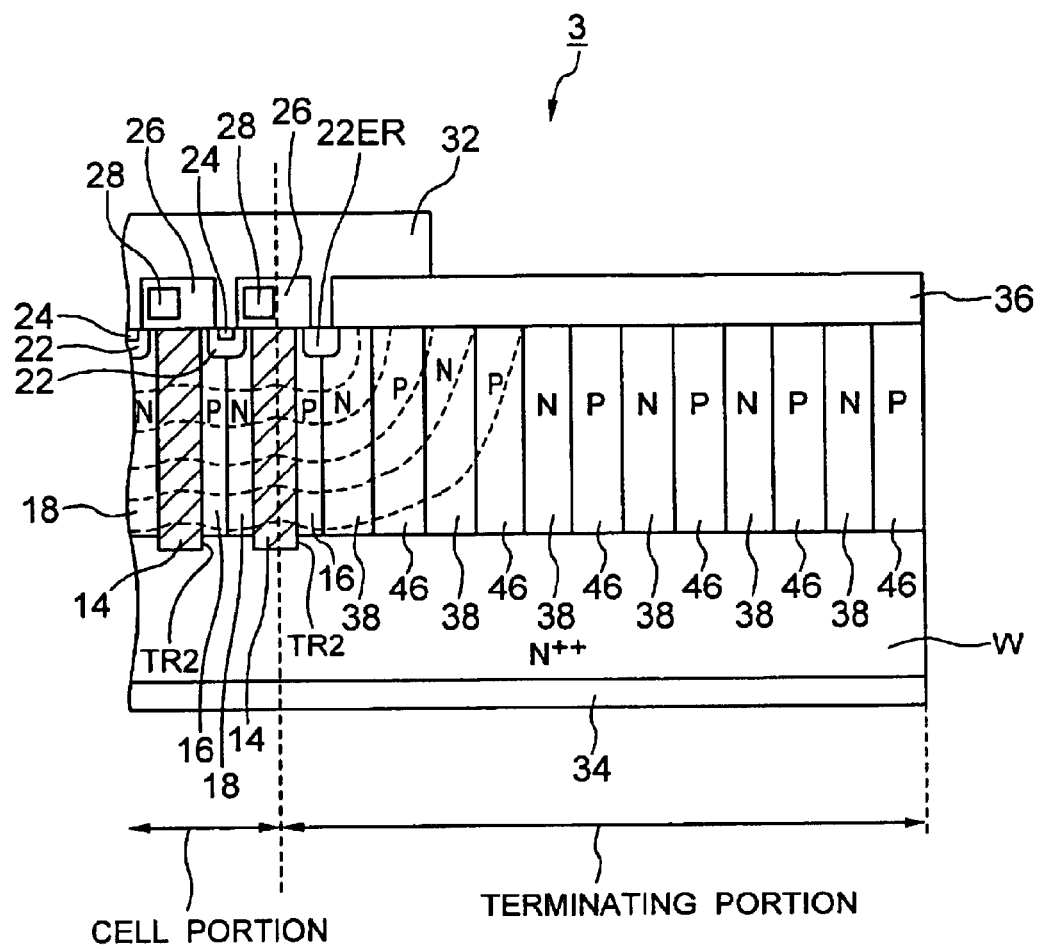
FIG. 6 is a cross-sectional view taken along line C—C in FIG. 5.
Figure 7:
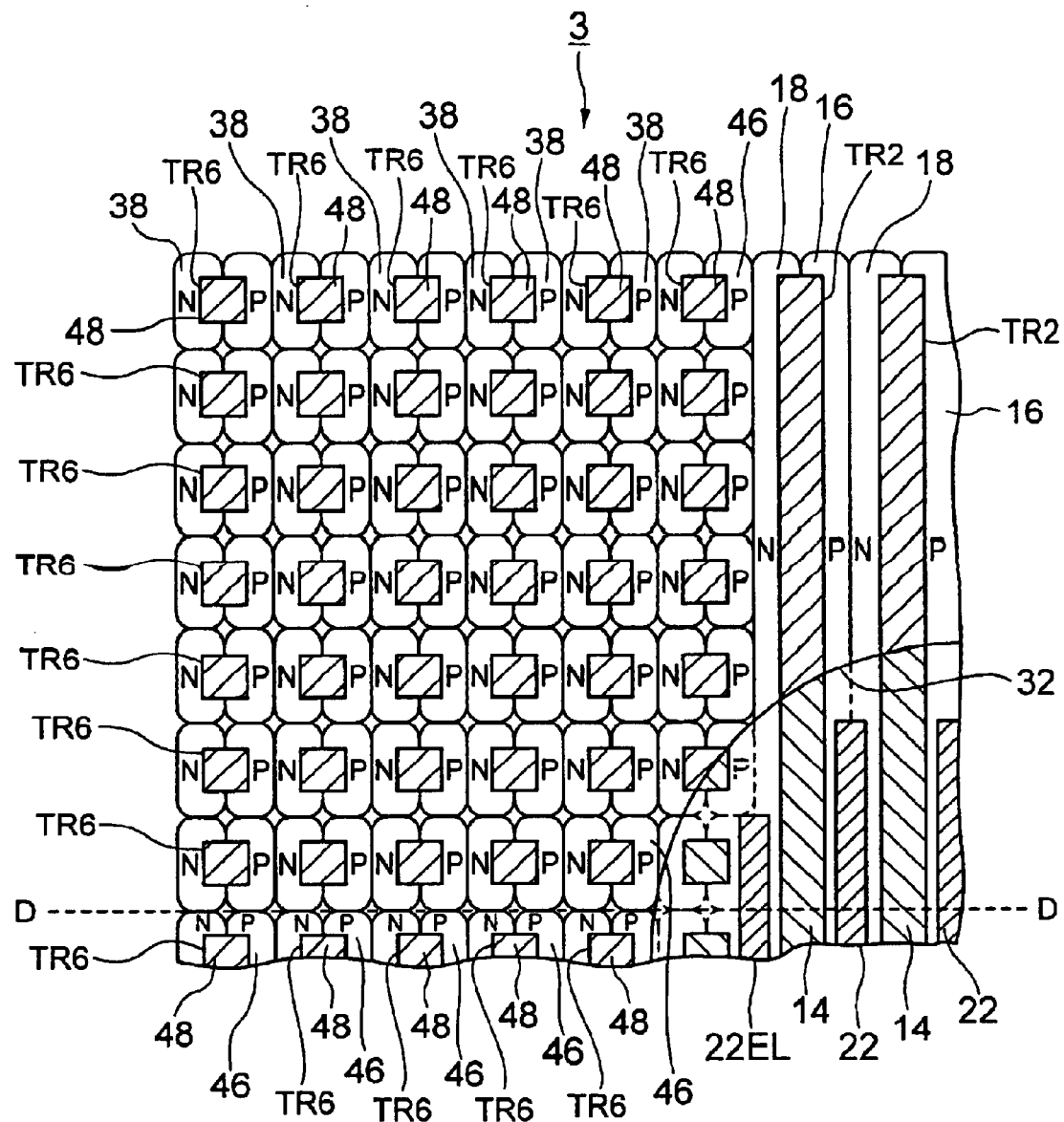
FIG. 7 is a plan view showing an opposite side of a terminating portion of the semiconductor device shown in FIG. 5.
Figure 8:
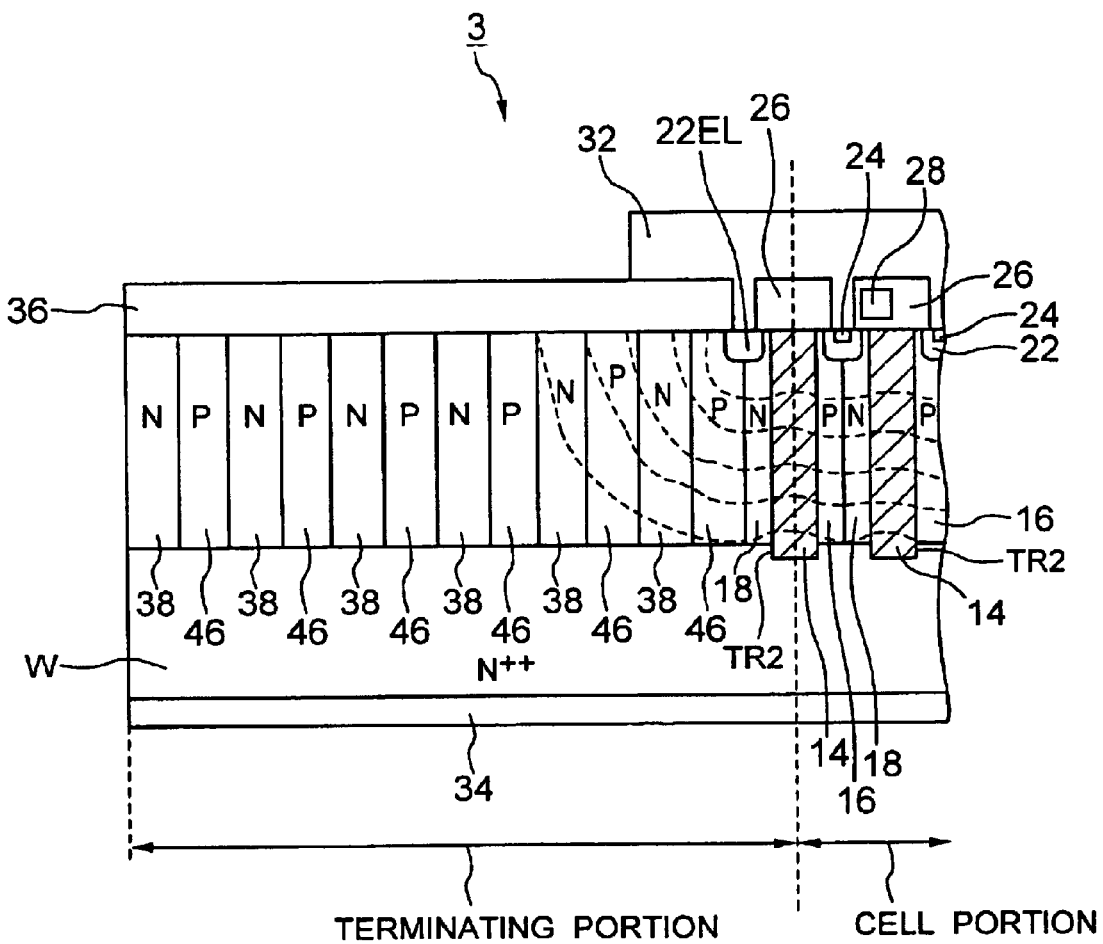
FIG. 8 is a cross-sectional view taken along line D—D in FIG. 7.
Figure 9:
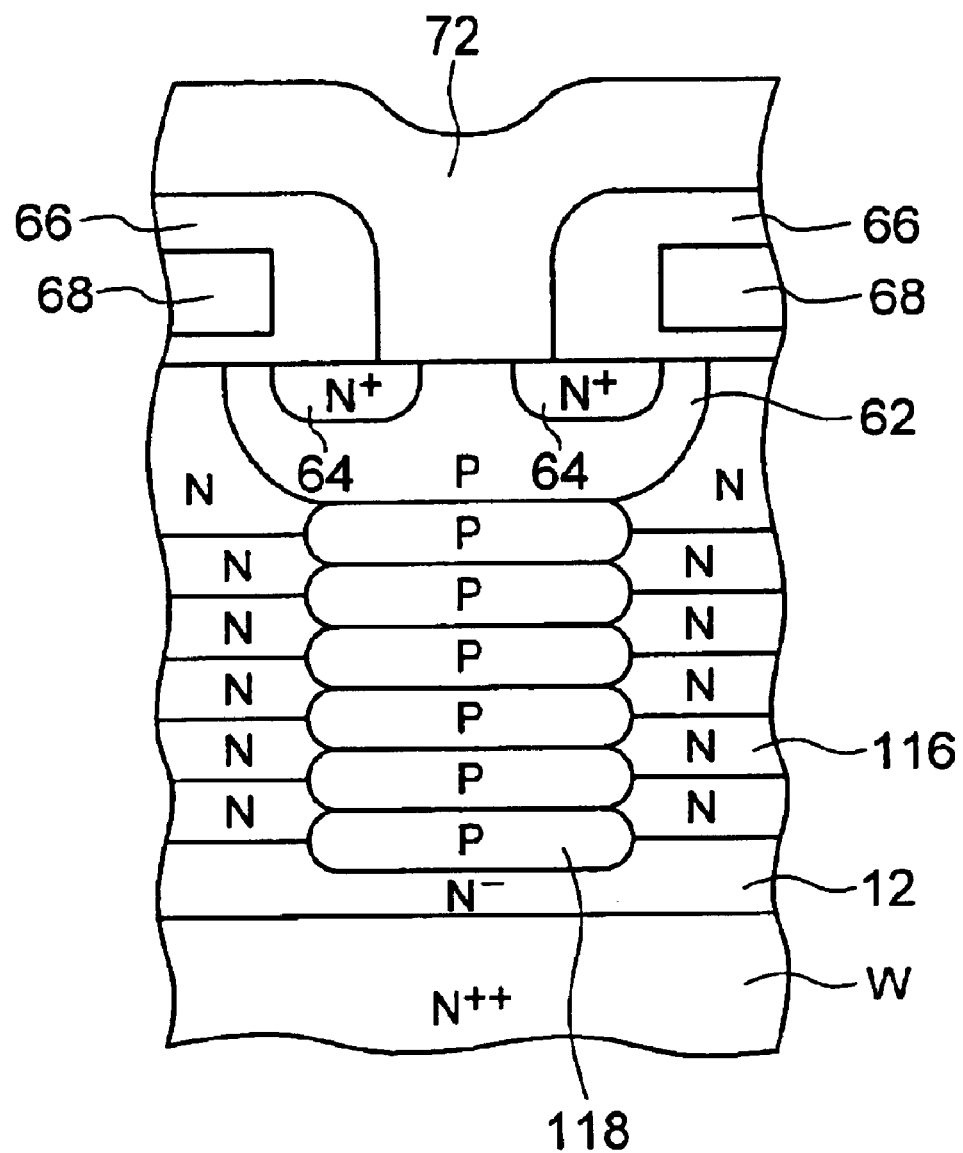
FIG. 9 is a cross-sectional view showing one example of a multi RESURF structure according to the related art.
Figure 10:
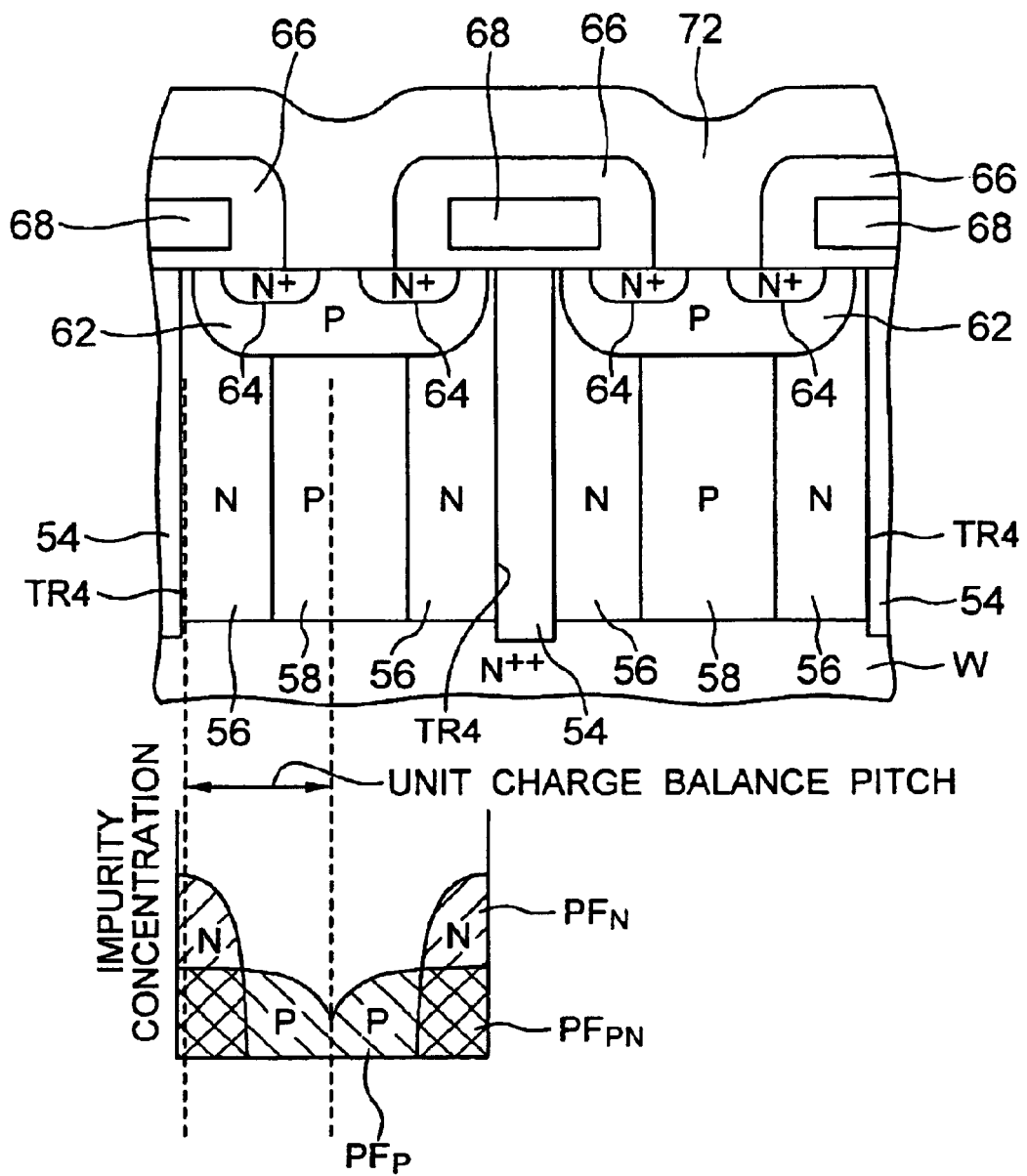
FIG. 10 is a diagram illustrating another example of a trench multi RESURF structure according to the related art.
Figure 11:
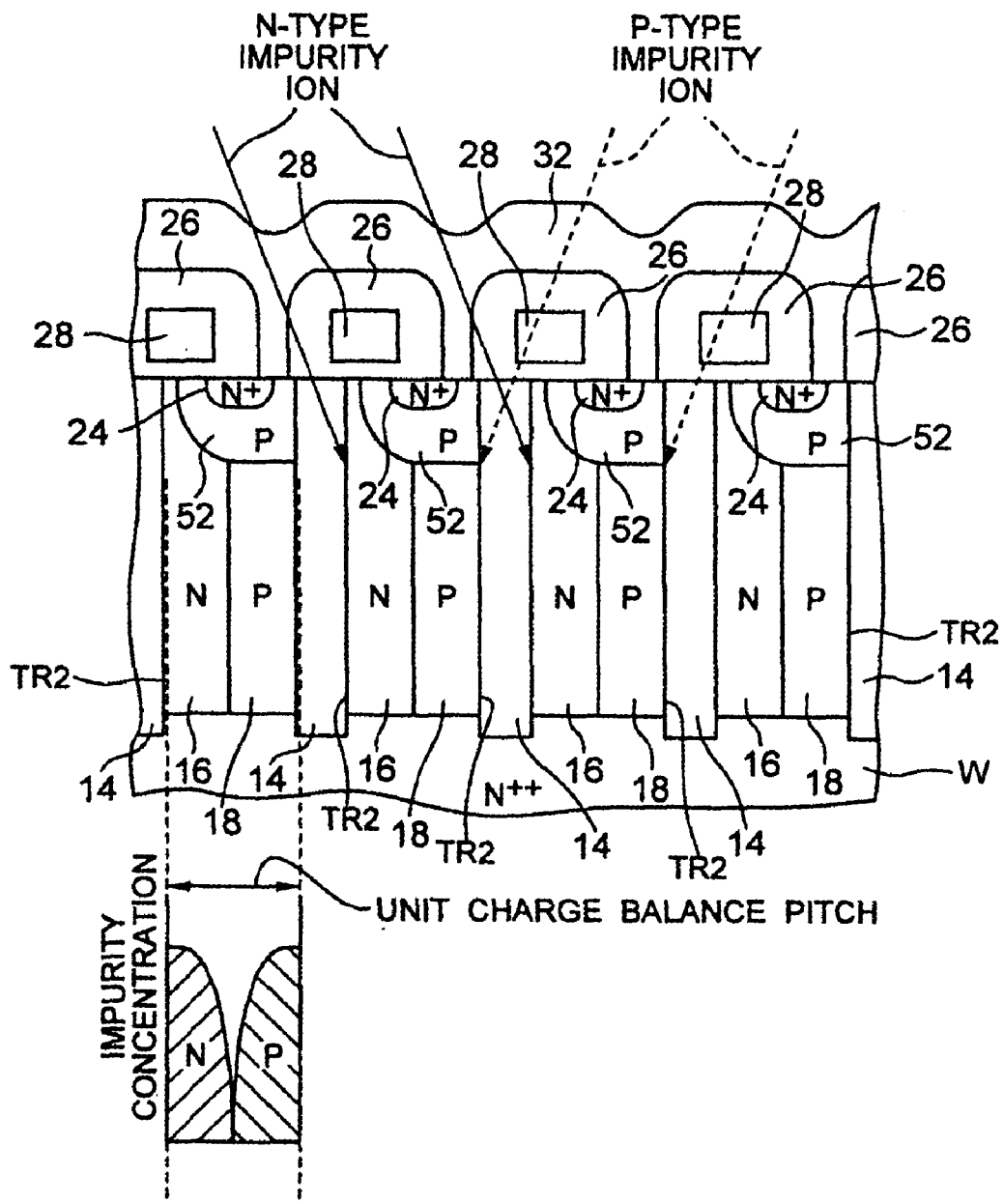
FIG. 11 is a diagram illustrating still another example of the trench multi RESURF structure according to the related art.
Figure 12:
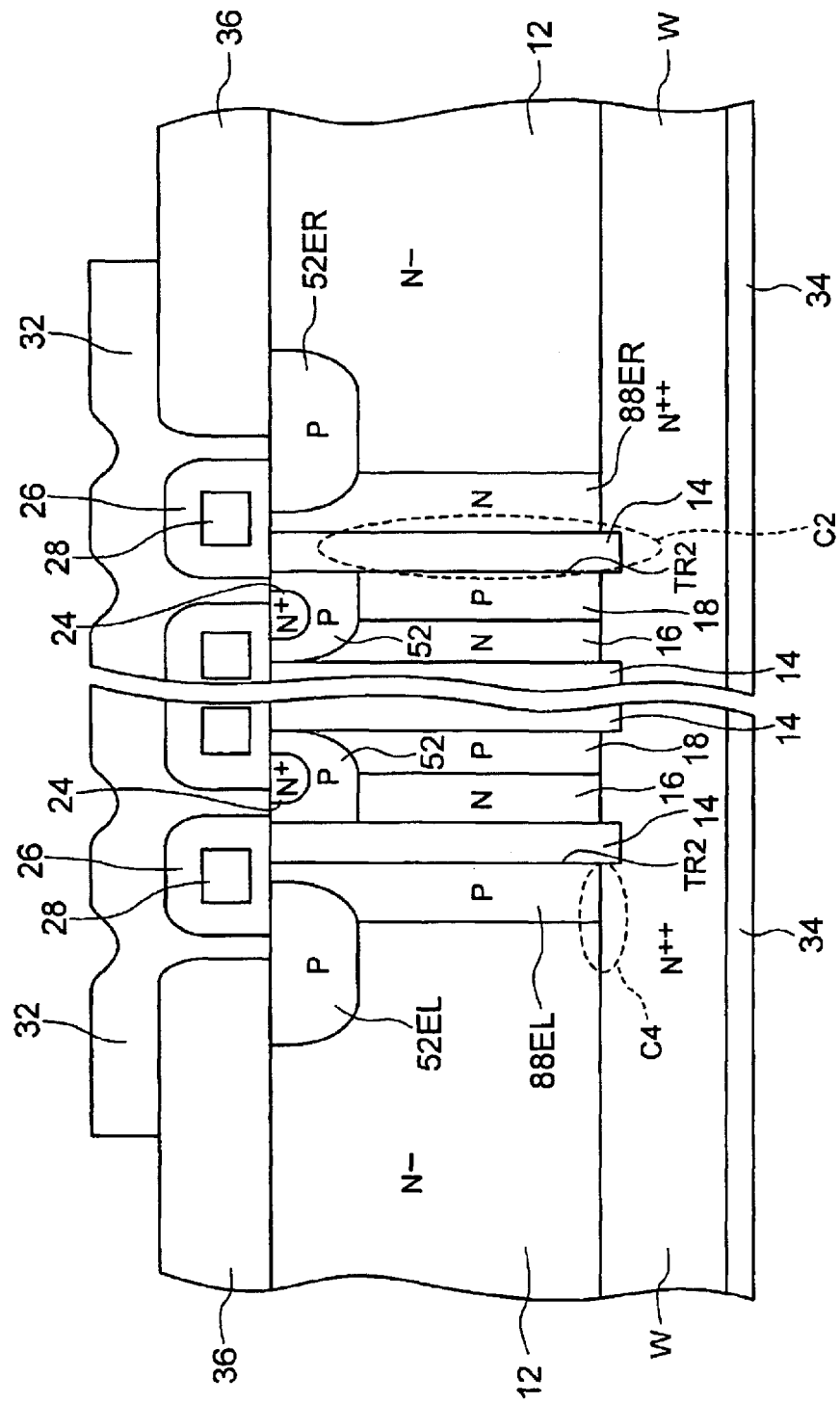
FIG. 12 is a schematic cross-sectional view showing a structure of the terminating portion of a MOSFET shown in FIG. 11.

FIG. 5 is a plan view showing one side of a terminating portion of the second embodiment of the semiconductor device according to the present invention, and FIG. 6 is a cross-sectional view taken along line C—C of FIG. 5. FIG. 7. is a plan view showing the opposite side of the terminating portion of the semiconductor device shown in FIG. 5, and FIG. 8 is a cross-sectional view taken along line D—D of FIG. 7. The semiconductor device according to this embodiment is characterized in that the combination of the N layer and P layer is successively formed up to the peripheral edge in the terminating portion of the device so as to have the same charge compensation structure throughout the device. A power MOSFET 3 of the vertical trench multi RESURF structure according to this embodiment is formed, in order to obtain such a charge compensation structure, so that trenches TR8 in the terminating portion have a rectangular plane shape individually and are disposed in a mesh form. Before an insulator 48 is buried into the trench TR8 thus formed, the N layer 38 and the P type 46 may be formed by implanting the N type impurity and the P type impurity into the left and right side faces of the trench TR8 in a plane view, respectively, followed by a diffusion process by the heat treatment. Other structures of the power MOSFET 3 shown in FIGS. 5 to 8 are substantially the same as those of the power MOSFET 1 shown in FIGS. 1 to 4.

Thus, according to the power MOSFET 3 in this embodiment, the trenches in the breakdown voltage terminating portion are formed in a finely separated manner in the same direction with the repetitive direction of the P layer 16 and N layer 18 in the cell portion, thereby allowing the connection of the N layer 38 and P layer 46 for charge compensation. This relieves the concentration of the electric potential as shown by a dotted line in FIGS. 6 and 8, and facilitates discharge of the electric charge. In addition, thus precise pattern designing in the terminating portion also enables to obtain the structure of preventing a residue of the regions of the epitaxial growth layer 12 (see FIGS. 2 and 3) which might cause charge unbalance, therefore the semiconductor device capable of preventing a decrease in the breakdown voltage in the terminating portion can be realized.

While embodiments of the present invention have been described herein, the present invention is not limited to these embodiments, and it is obvious to those skilled in the art that changes and variations modifications can be made within the spirit and the scope of the invention. For example, in the foregoing first embodiment, it is described the case where the N layers 18EL and 18ER are provided to the peripheral edge of the device, however, it is not limited to these layers, and it may alternatively be possible that the P layer is provided to the peripheral edge. Furthermore, the insulators 14, 44, and 48 are used as a dielectric to be buried into the trenches TR2, TR6, and TR8, respectively, however, it is not limited to these insulators, and it may alternatively be possible that polysilicon is used which is, for example, buried through epitaxial growth via a silicon oxide film or a silicon nitride film.

What is claimed is:

1. A semiconductor device comprising:
   a semiconductor substrate of a first conductivity type;
   a semiconductor layer of a first conductivity type formed on a first main surface of the semiconductor substrate, the semiconductor layer including a first region for a cell portion and a second region for a terminating portion, the second region being positioned in an outer periphery of the first region, said terminating portion maintaining breakdown voltage by extending a depletion layer to relieve an electric field;
   junction pairs of semiconductor layers periodically arranged so as to form a line from the first region to the second region in a first direction parallel to the first main surface in the semiconductor layer and having mutually opposite conductivity types of impurities, each of said junction pair being composed of a first impurity diffusion layer of a second conductivity type formed from a surface of the semiconductor layer toward the semiconductor substrate and a second impurity diffusion layer of a first conductivity type formed from the surface of the semiconductor layer toward the semiconductor substrate and adjacently to the first impurity diffusion layer;

a base layer of a second conductivity type selectively formed on each surface layer of said junction pairs which are formed in the first region, so as to connect with the first impurity diffusion layer and the second impurity diffusion layer in the same manner;

a source layer of a first conductivity type selectively formed on each surface layer of the base layers of the second conductive type;

a control electrode formed above each surface of the base layers and above each surface of the source layers via an insulating film;

a first main electrode formed so as to cover the control electrode and to contact the source layers and the base layers in the same manner; and a second main electrode formed on a second main surface opposite to the first main surface of the semiconductor substrate.

2. The semiconductor device according to claim 1, which further comprises:

a first dielectric formed from the surface of the semiconductor layer toward the semiconductor substrate in the first region so as to fill a first trench, each of the first trenches having a stripe plane shape and a longitudinal direction of each of the first trenches being a second direction orthogonal to the first direction; and a second dielectric formed from the surface of the semiconductor layer toward the semiconductor substrate in the second region so as to fill second trenches periodically arranged at least in the second direction, wherein the junction pair in the first region is formed between the adjacent second dielectrics, and the junction pairs in the second region include at least a junction pair composed of a cell peripheral impurity diffusion layer which is the impurity diffusion layer formed from an outer side face of the first trench closest to a peripheral edge in the first direction toward the peripheral edge and an impurity diffusion layer formed from the side face closest to the first region among side faces of the second trench toward the first region and having an conductivity type opposite to that of the cell peripheral impurity diffusion layer.

3. The semiconductor device according to claim 2, wherein the second trenches have a plane stripe shape, longitudinal directions of the second trenches being the same as the first direction.

4. The semiconductor device according to claim 2, wherein the second trenches have a rectangular plane shape, respectively, and are periodically arranged in the first and second directions so as to form a lattice in a plane view, and said junction pairs are arranged up to side faces on the first region side of the second trenches positioned closest to the peripheral edge.

5. The semiconductor device according to claim 3, wherein the first trenches are formed to extend in the second direction from the first region to the vicinity of a peripheral edge of the second region, and said junction pairs in the first region are extended in the second direction up to the peripheral edge of the second region, and the extended portions constitute the junction pairs in the terminating portion in the second direction.

6. The semiconductor device according to claim 4, wherein the first trenches are formed to extend in the second direction from the first region to the vicinity of a peripheral edge of the second region, and said junction pairs in the first region are extended in the second direction up to the peripheral edge of the second region, and the extended portions constitute the junction pairs in the terminating portion in the second direction.

7. The semiconductor device according to claim 2, which further comprises:

a third impurity diffusion layer of a first conductivity type formed from the surface of the semiconductor layer toward the semiconductor substrate in a peripheral edge portion in the first direction.

8. The semiconductor device according to claim 2, which further comprises:

a fourth impurity diffusion layer of a second conductivity type formed from the surface of the semiconductor layer toward the semiconductor substrate in the peripheral edge portion in the first direction.

9. The semiconductor device according to claim 1, wherein the junction pairs are formed so as to contact the semiconductor substrate.

10. The semiconductor device according to claim 1, which further comprises:

a field insulating layer provided on a surface of the terminating portion.

* * * * *